US011367376B2

(12) United States Patent
Wu et al.

(10) Patent No.: US 11,367,376 B2
(45) Date of Patent: Jun. 21, 2022

(54) DISPLAY PANEL AND DISPLAY DEVICE

(71) Applicant: KUNSHAN GO-VISIONOX OPTO-ELECTRONICS CO., LTD., Kunshan (CN)

(72) Inventors: Jianlong Wu, Kunshan (CN); Siming Hu, Kunshan (CN); Zhenzhen Han, Kunshan (CN)

(73) Assignee: KUNSHAN GO-VISIONOX OPTO-ELECTRONICS CO., LTD., Kunshan (CN)

(*) Notice: Subject to any disclaimer, the term of this patent is extended or adjusted under 35 U.S.C. 154(b) by 629 days.

(21) Appl. No.: 16/330,201

(22) PCT Filed: Apr. 28, 2018

(86) PCT No.: PCT/CN2018/085016
§ 371 (c)(1),
(2) Date: Mar. 4, 2019

(87) PCT Pub. No.: WO2019/041861
PCT Pub. Date: Mar. 7, 2019

(65) Prior Publication Data
US 2021/0350736 A1    Nov. 11, 2021

(30) Foreign Application Priority Data
Aug. 31, 2017    (CN) .......................... 201710774056.6

(51) Int. Cl.
*G09G 3/20*    (2006.01)
*G09G 3/00*    (2006.01)
(Continued)

(52) U.S. Cl.
CPC ........... *G09G 3/2003* (2013.01); *G09G 3/006* (2013.01); *H01L 27/326* (2013.01);
(Continued)

(58) Field of Classification Search
None
See application file for complete search history.

(56) References Cited

U.S. PATENT DOCUMENTS 10,084,029 B2 *   9/2018   Lee ..................... H01L 27/3248
11,227,527 B2 *   1/2022   Wu ....................... G09G 3/2003
(Continued)

FOREIGN PATENT DOCUMENTS

CN   1728222 A    2/2006
CN   102110410 A  6/2011
(Continued)

OTHER PUBLICATIONS

Korean Office Action dated Jun. 22, 2020, in connection with corresponding KR Application No. 10-2019-7025715 (13 pgs., including machine-generated English translation).
(Continued)

*Primary Examiner* — Patrick N Edouard
*Assistant Examiner* — Peijie Shen
(74) *Attorney, Agent, or Firm* — Maier & Maier, PLLC

(57) ABSTRACT

The present application provides a display panel and a display device. The display panel includes a plurality of sub-pixels. Each sub-pixel includes a light-emitting unit and a drive switch electrically connected to a first electrode of the light-emitting unit. The light-emitting units in the multiple sub-pixels form a pixel array. Multiple light-emitting units in at least one pixel column of the pixel array correspond to sub-pixels of at least two colors. The drive switches in the multiple sub-pixels form a drive array. In the drive array, in drive columns correspondingly connected to the at least one pixel column, multiple drive switches in at least one drive column drive-control light-emitting units of the
(Continued)

same color. Thus, the corresponding drive column can be connected to a peripheral drive circuit by using only one switch element.

19 Claims, 7 Drawing Sheets

(51) Int. Cl.
  *H01L 27/32* (2006.01)
  *H01L 21/66* (2006.01)
(52) U.S. Cl.
  CPC ...... *H01L 27/3213* (2013.01); *H01L 27/3218* (2013.01); *G09G 2300/0426* (2013.01); *G09G 2300/0452* (2013.01); *H01L 22/30* (2013.01); *H01L 27/3211* (2013.01)

(56) References Cited

U.S. PATENT DOCUMENTS

| | | | |
|---|---|---|---|
| 2004/0051724 A1* | 3/2004 | Elliott | G02F 1/133514 345/589 |
| 2004/0140983 A1 | 7/2004 | Credelle | |
| 2005/0247939 A1* | 11/2005 | Iketsu | H01L 51/5221 438/149 |
| 2011/0043500 A1* | 2/2011 | Kwak | G09G 3/006 345/206 |
| 2013/0113839 A1 | 5/2013 | Huang | |
| 2014/0078032 A1 | 3/2014 | Xia et al. | |
| 2014/0240521 A1* | 8/2014 | Kwak | H04N 17/004 348/189 |
| 2014/0264290 A1 | 9/2014 | Brown et al. | |
| 2014/0354285 A1* | 12/2014 | Kim | G01R 31/44 324/414 |
| 2015/0090970 A1 | 4/2015 | Park et al. | |
| 2015/0364526 A1* | 12/2015 | Peng | H01L 27/3218 118/504 |
| 2016/0204138 A1* | 7/2016 | Park | H01L 27/1262 438/623 |
| 2016/0253972 A1* | 9/2016 | Bai | H01L 27/3216 345/690 |
| 2016/0275846 A1* | 9/2016 | Gu | G09G 3/2074 |

FOREIGN PATENT DOCUMENTS

| | | | | |
|---|---|---|---|---|
| CN | 103185995 A | | 7/2013 | |
| CN | 103280162 A | | 9/2013 | |
| CN | 104319283 A | | 1/2015 | |
| CN | 104616612 A | | 5/2015 | |
| CN | 104656295 A | | 5/2015 | |
| CN | 104854651 A | | 8/2015 | |
| CN | 105182644 A | | 12/2015 | |
| CN | 106297615 A | | 1/2017 | |
| CN | 106297640 A | | 1/2017 | |
| CN | 106444196 A | | 2/2017 | |
| CN | 106444196 A | * | 2/2017 | ........... G02F 1/1343 |
| JP | S60-218627 A | | 11/1985 | |
| JP | 2014102321 A | | 6/2014 | |
| KR | 20130000997 A | * | 1/2013 | |
| KR | 20130000997 A | | 1/2013 | |
| KR | 10-2014-0108027 A | | 9/2014 | |
| KR | 10-2016-0129688 A | | 11/2016 | |
| TW | 201448077 A | | 12/2014 | |
| TW | I562108 B | | 12/2016 | |

OTHER PUBLICATIONS

Japanese Office Action dated Sep. 14, 2021, in connection with corresponding JP Application No. 2019-569534 (5 pp., including machine-generated English translation).
Office Action dated May 24, 2019 in corresponding Chinese Application No. 201710774056.6, 12 pages including an English-language translation of the Search Report.
Japanese Office Action dated Nov. 17, 2020, in connection with corresponding JP Application No. 2019-569534 (8 pp., including machine-generated English translation).
International Search Report dated Jul. 27, 2018 in corresponding International application No. PCT/CN2018/085016; 3 pages.
Taiwanese Office Action dated Dec. 20, 2018, in connection with corresponding TW Application No. 107115756; 9 pages including Partial English-language translation.
Extended European Search Report dated Jul. 13, 2020 in corresponding European U.S. Appl. No. 18/851,432; 13 pages.

* cited by examiner

DISPLAY PANEL AND DISPLAY DEVICE

CROSS-REFERENCE TO RELATED APPLICATION

The application claims the benefit of priority of Chinese Patent Application No. 201710774056.6, filed on Aug. 31, 2017, and the entire disclosures of which are incorporated herein.

TECHNICAL FIELD

The present application relates to the field of panel display technologies, and in particular, to a display panel and a display device.

BACKGROUND

In recent years, many kinds of display panels have been developed at home and abroad, such as liquid crystal display panels, plasma display panels, electrowetting display panels, electrophoretic display panels, and organic light-emitting display panels. In addition, different pixel arrangements emerge so as to improve the pixel display resolution.

A pixel arrangement of a conventional display panel is successively arranging sub-pixels according to an RGB sequence in a row direction to form a regular pixel array. The multiple sub-pixels in a column direction of the pixel array correspond to the same color. However, this pixel arrangement in which the sub-pixels in the column direction correspond to the same color renders the display resolution unsatisfied. Therefore, many pixel arrangements which are not based on a successive RGB sequence in the row direction are emerged, so that the sub-pixels in the column direction correspond to different colors. Such an irregular arrangement can improve the display resolution and achieve a desirable display effect.

In spite of the improvement in the display resolution, this irregular pixel arrangement for the display panel further makes drive switches in each column of a drive array electrically connected to the pixel array correspond to different colors. Thus, at least two data lines need to be provided for each drive column. As such, a peripheral drive circuit in a non-display region of the display panel needs to be configured with a lot of data lines, which leads to a complicated structure connected to the data lines in the peripheral drive circuit. However, a complicated peripheral drive circuit usually affects a display effect of the display panel. For example, when the peripheral drive circuit is a cell test (CT) circuit, a mura problem of black stripes usually occurs during screen tapping in the case of a complicated CT circuit.

It can be seen that, how to optimize the peripheral drive circuit on the premise of ensuring the display effect of the display panel is of a great importance.

SUMMARY

An objective of the present application is to provide a display panel, so as to solve the problem of a complicated structure of the peripheral drive circuit after enhancement of display resolution of the display panel in the prior art.

Optionally, the drive switch includes a drive transistor, and a drain electrode of the drive transistor is electrically connected to the first electrode.

To solve the foregoing problem, the present application provides a display panel, including a plurality of sub-pixels formed in a display region, where each sub-pixel includes a light-emitting unit and a drive switch, the light-emitting unit includes a first electrode, the drive switch is electrically connected to the first electrode, and the light-emitting units in the multiple sub-pixels form a pixel array including a plurality of pixel columns, wherein: the light-emitting units in at least one pixel column of the pixel array correspond to sub-pixels of at least two different colors; the drive switches in the multiple sub-pixels form a drive array; in the drive array, in drive columns correspondingly connected to the at least one pixel column, the drive switches in at least one drive column drive-control the light-emitting units of the same color.

Optionally, the display panel further includes a peripheral drive circuit located in a non-display region, the peripheral drive circuit including a source drive circuit providing data signals to the drive switches.

Optionally, the display panel further includes a plurality of switch elements, wherein in the same drive column, the source drive circuit provides corresponding data signals for the drive switches corresponding to different colors by the different switch elements.

Optionally, the source drive circuit includes multiple switch signal lines and multiple data signal lines, the switch elements are connected to the switch signal lines and the data signal lines, and the switch signal lines are used for controlling conduction of the switch elements, and the data signal lines provide data signals for the drive switches of a corresponding color by the switch elements.

Optionally, in different drive columns, each of the switch elements corresponding to the drive switches of the same color is connected to the same switch signal line.

Optionally, in each drive column corresponding to the same color, the plurality of drive switches in the drive column are connected to the peripheral drive circuit by one switch element.

Optionally, only one switch signal line is configured in the peripheral drive circuit for the drive columns corresponding to the same color.

Optionally, only one data signal line is configured in the peripheral drive circuit for the drive columns corresponding to the same color.

Optionally, in each drive column not corresponding to the same color, the multiple drive switches in the drive column correspond to at least two colors.

Optionally, in each drive column not corresponding to the same color, the plurality of drive switches corresponding to the at least two colors are connected to at least two switch elements.

Optionally, in each drive column not corresponding to the same color, the drive switches corresponding to the same color are connected to the same data signal line through the same switch element.

Optionally, the light-emitting units of the multiple sub-pixels correspond to three different colors, and the drive switches corresponding to one of the colors are independently and repeatedly arranged in a column direction, while the drive switches corresponding to the other two colors are alternately arranged in the column direction.

Optionally, the light-emitting units of the multiple sub-pixels correspond to four different colors, and the drive switches corresponding to two of the four different colors are independently and repeatedly arranged in respective columns, while the drive switches corresponding to the other two colors are alternately arranged in a column direction.

Optionally, each drive switch is electrically connected to the first electrode via a contact hole, a drive column corresponding to a same predetermined color is arranged between adjacent two pixel columns, and the first electrodes corresponding to the same predetermined color extend to a region between the two pixel columns, and are connected to the contact holes of the drive switches corresponding to the same predetermined color.

Optionally, the multiple sub-pixels correspond to three different colors, in the column direction of the pixel array, the light-emitting units corresponding to the three different colors are successively arranged, and in a row direction of the pixel array, the light-emitting units corresponding to a same color are staggered along the column direction.

Optionally, a plurality of sub-pixels forms a plurality of pixel units arranged in an array, each pixel unit includes three sub-pixels corresponding to different colors, and the light-emitting units of the three sub-pixels in each pixel unit are arranged in adjacent two columns of the pixel array.

Optionally, an arrangement structure obtained by reversing each pixel unit by 180 degrees along a row direction is identical with an arrangement structure of an adjacent pixel unit in a same column.

Based on the foregoing display panel, the present application also provides a display device including the above-described display panel.

In the display panel provided by the present application, the multiple light-emitting units in at least one pixel column of the pixel array correspond to sub-pixels of at least two colors. Compared with the conventional pixel arrangement in which the sub-pixels in the column direction all correspond to the same color, the display device of the present application can effectively improve the display resolution and display uniformity. As such, drive switches in least one column of the drive array correspond to the same color, such that drive columns corresponding to the same color can be connected to the peripheral drive circuit only via the same switch element P. Compared with the conventional method in which multiple drive switches in the same drive column do not correspond to the same color and thus need to use several switch elements so as to be connected to the peripheral circuit, the arrangement of the drive array of the present application can effectively reduce the number of the switch elements, and further simplify the structure of the peripheral drive circuit. For example, for drive columns corresponding to the same color, only one switch signal line can be provided in the peripheral drive circuit, thus the number of lines in the peripheral drive circuit is reduced. The peripheral drive circuit may be, for example, a CT circuit.

DETAILED DESCRIPTION

As described in the background, in order to achieve a high display resolution of a display panel, the prior art usually uses an irregular pixel arrangement which is not based on a successive RGB sequence, such that sub-pixels in the column direction of the pixel array correspond to at least two colors. To adapt to this irregular pixel arrangement, drive switches are also not regularly arranged according to the RGB sequence, which not only complicates an electrical connection between the drive switches and the light-emitting units, but also complicates the peripheral drive circuit.

Figure 1:
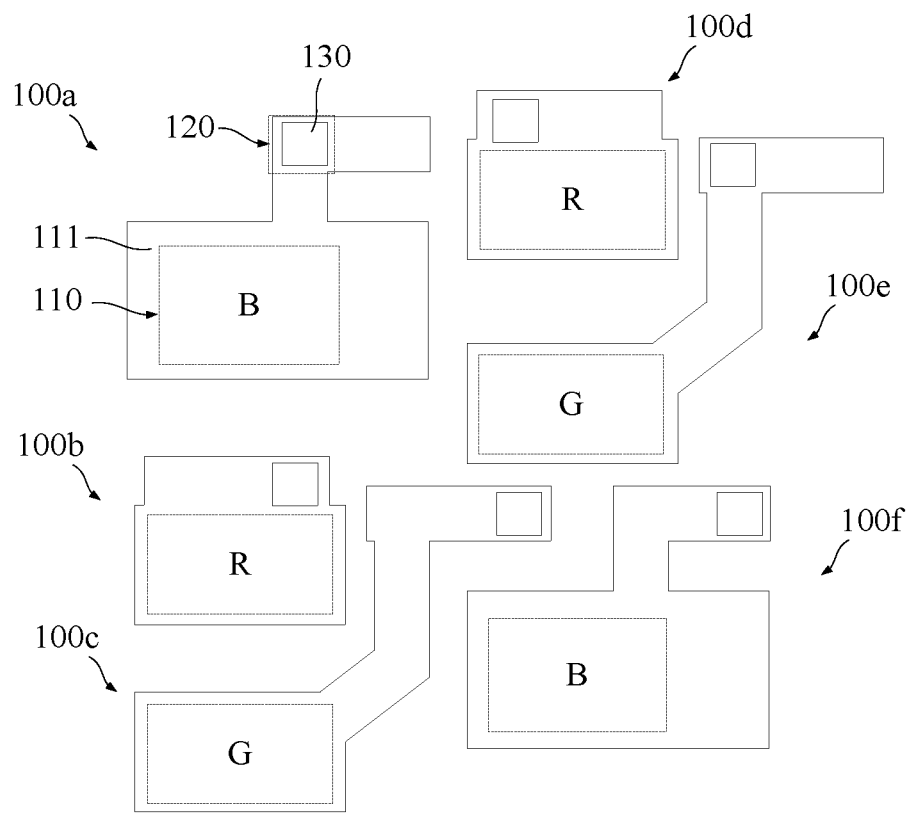
FIG. 1 is a schematic structural diagram of a display region of a display panel.

For example, FIG. 1 is a schematic structural diagram of a display region of a display panel. As shown in FIG. 1, the display panel includes a plurality of sub-pixels formed in a display region of a substrate, and the plurality of sub-pixels corresponds to at least three colors. It should be noted that, FIG. 1 shows only six sub-pixels, namely, a first sub-pixel 100*a*, a second sub-pixel 100*b*, a third sub-pixel 100*c*, a fourth sub-pixel 100*d*, a fifth sub-pixel 100*e*, and a sixth sub-pixel 100*f*. The multiple sub-pixels shown in FIG. 1 correspond to three colors, which are red R, green G, and blue B. Each sub-pixel includes a light-emitting unit 110 and a drive switch 120. Each light-emitting unit includes a first electrode 111, and the drive switch 120 is electrically connected to the first electrode 111.

The light-emitting units 110 in the multiple sub-pixels form a pixel array, and the multiple light-emitting units 110 in a column direction of the pixel array correspond to at least two different colors. For example, in the pixel array shown in FIG. 1, the light-emitting units 110 in the first column successively correspond to blue B, red R and green G; and the light-emitting units 110 in the second column successively correspond to red R, green G and blue B. With continued reference to FIG. 1, the drive switches 120 in the multiple sub-pixels 100 form a drive array. In the drive array, the drive switches 120 in the first column successively correspond to blue B and red R. The drive switches 120 in the second column successively correspond to red R and green G. The drive switches 120 in the third column successively correspond to green G and blue B. That is, in the drive array, two drive switches 120 in each column are electrically connected to light-emitting units 110 of two different colors respectively. It can be seen that, for a pixel array which is not arranged according to a successive RGB sequence in the row direction, because the light-emitting units in the column direction of the pixel array do not correspond to the same color, the multiple drive switches arranged in the column direction of the drive array corresponding to the pixel array also do not correspond to the same color.

Figure 2:
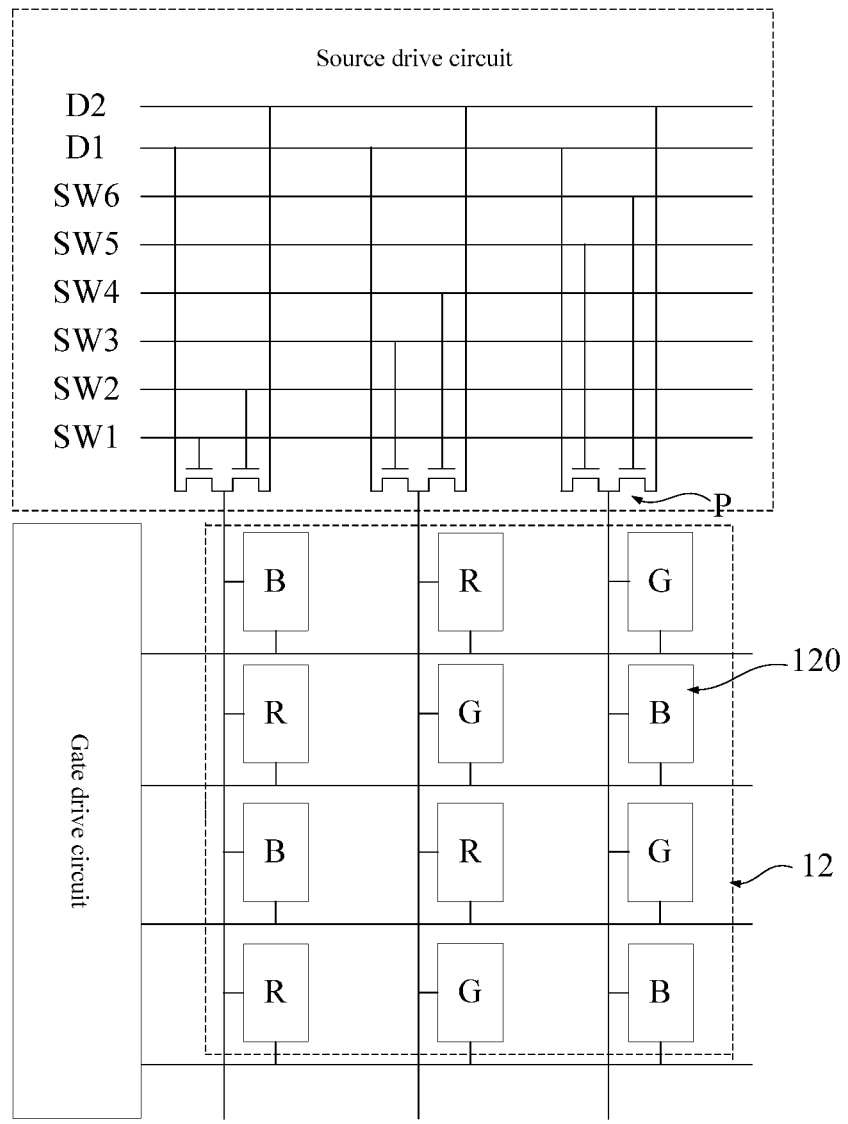
FIG. 2 is a schematic diagram showing a connection between a drive array and a peripheral drive circuit according to the display panel shown in FIG. 1.

FIG. 2 is a schematic diagram showing a connection between a drive array and a peripheral drive circuit in the display panel shown in FIG. 1, wherein the peripheral drive circuit is, for example, a CT circuit. Focusing on FIG. 2, the drive switches 120 in the same column of the drive array 12 do not correspond to the same color. Thus, the multiple drive switches 120 in the same drive column need to be provided with corresponding data signals according to the different colors. That is, several switch elements P need to be configured in the same drive column based on the different colors so as to be connected to the peripheral drive circuit. Accordingly, corresponding switch signal lines further need to be provided in the peripheral drive circuit for the several switch elements P corresponding to the different colors, so that a connection/disconnection of the different switch elements P can be controlled by using the corresponding switch signal lines. Thus, data signals can be provided for the sub-pixels of different colors by using the different switch elements P. Because the multiple drive switches 120 in each drive column correspond to at least two colors, at least two corresponding switch elements P also need to be configured in each drive column. Moreover, in order to provide corresponding data signals for the drive switches 120 of different colors in the different drive columns, a lot of switch signal lines need to be further configured, so as to control the switch elements P corresponding to different colors in the different drive columns, which directly complicates the structure of the used peripheral drive circuit. For example, as shown in FIG. 2, the multiple drive switches 120 in the first column correspond to blue B and red R, and therefore it is required to provide two switch elements P which are respectively connected to switch signal lines SW1 and SW2. Similarly, it is also required to set two switch elements P in the second drive column, and correspondingly provide switch signal lines SW3 and SW4. And it is further required to set two switch elements P in the third drive column, and correspondingly provide switch signal lines SW5 and SW6.

The display resolution and display uniformity of the display panel can be improved when the irregular pixel arrangement is used to enable multiple light-emitting units in the column direction of the pixel array to correspond to at least two colors. However, it can be known from FIGS. 1 and 2 that, such an arrangement complicates the connection between the light-emitting units and the drive switches in the sub-pixels, and further complicates the structure of the peripheral drive circuit.

Therefore, the present application provides a display panel, which includes a plurality of sub-pixels formed in a display region. Each sub-pixel includes a light-emitting unit and a drive switch. Each light-emitting unit includes a first electrode. The drive switch is electrically connected to the first electrode. The light-emitting units in the multiple sub-pixels form a pixel array, and multiple light-emitting units in at least one pixel column of the pixel array correspond to sub-pixels of at least two colors. The drive switches in the multiple sub-pixels form a drive array. In drive columns correspondingly connected to the at least one pixel column in the drive array, multiple drive switches in at least one drive column are all used to drive-control the light-emitting units of the same color.

That is, the display panel of the present application still uses an irregular pixel arrangement, such that the pixel array has pixel columns in which multiple light-emitting units 210 in the column direction do not correspond to the same color, thus ensuring a high resolution of the display panel. As such, in the drive array, multiple drive switches in at least one column are electrically connected to light-emitting units of the same color. Because the multiple drive switches in the corresponding column all correspond to the same color, its corresponding drive column can be connected to a peripheral drive circuit of the display panel by using only one switch element, and only one switch signal line needs to be provided for that corresponding drive column in the peripheral drive circuit, thus the structure of the peripheral drive circuit can be simplified. Moreover, the present application can simplify the peripheral drive circuit on the basis of an irregular pixel arrangement. In addition, a layout structure of the first electrodes electrically connected to the light-emitting units and the drive switches can be further adjusted according to relative positions of the light-emitting units and the drive switches, so that a connection between the light-emitting units and the drive switches can be simplified. Obviously, for various display panels using an irregular pixel arrangement, an arrangement of a drive array or a connection between light-emitting units and drive switches can be correspondingly adjusted according to the core idea of the present application so as to simplify the peripheral drive circuit.

A display panel and a display device of the present application are further described in detail below with reference to the accompanying drawings and specific embodiments. Advantages and features of the present application will be more apparent from the following description. It should be noted that the accompanying drawings are presented in a very simplified form not necessarily presented to scale, with the only intention to facilitate convenience and clarity in explaining the embodiments of the present application.

EMBODIMENT 1

Figure 3:
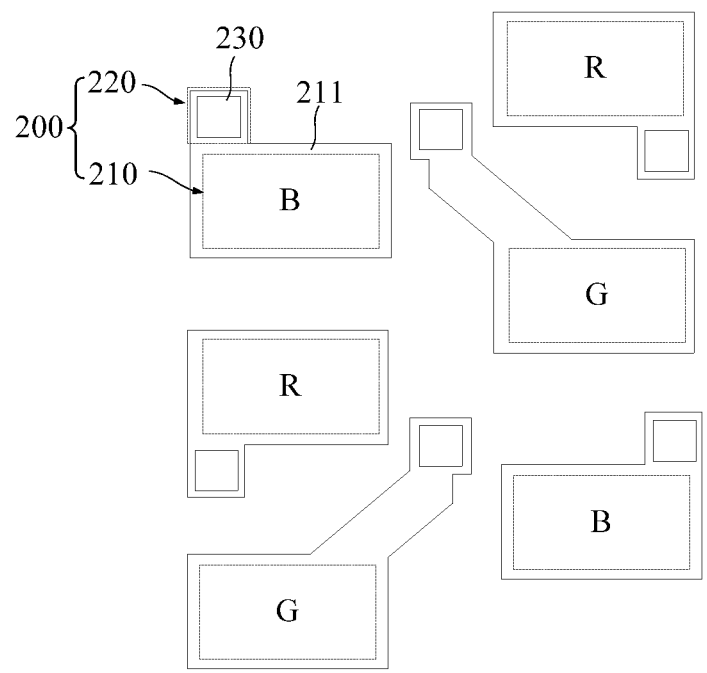
FIG. 3 is a schematic structural diagram of a display region of a display panel according to Embodiment 1 of the present application.

FIG. 3 is a schematic structural diagram of a display region of a display panel in Embodiment 1 of the present application. As shown in FIG. 3, the display panel includes a plurality of sub-pixels 200 formed in a display region. The plurality of sub-pixels 200 corresponds to at least three colors which are, for example, red R, blue B, and green G. This embodiment uses an example in which the multiple sub-pixels 200 correspond to three colors to make an explanation and a description. Alternatively, in order to further improve a display effect of the display panel, the multiple sub-pixels may also correspond to four colors which are, for example, red, green, blue, and white, or red, green, blue, and yellow. In addition, FIG. 3 schematically shows only six sub-pixels 200, but an actual number of sub-pixels in the display panel is not limited thereto and can be configured according to practical needs. Each of the sub-pixels 200 includes a light-emitting unit 210 and a drive switch 220. Each light-emitting unit 210 includes a first electrode 211, and the drive switch 220 is electrically connected to the first electrode 211. Further, the light-emitting unit 210 also includes a second electrode (not shown in the figure), and a light-emitting layer (not shown in the figure) located between the first electrode 211 and the second electrode. The first electrode 211 may serve as an anode, and the second electrode may serve as a cathode. Moreover, the drive switch 220 includes a drive transistor, and a drain electrode of the drive transistor is electrically connected to the first electrode 211.

The light-emitting units 210 of the multiple sub-pixels 200 form a pixel array, and multiple light-emitting units 210 in the same column form a pixel column. Multiple light-emitting units in at least one pixel column of the pixel array correspond to sub-pixels of at least two different colors. That is, the pixel array has pixel columns in which multiple light-emitting units 210 in the column direction correspond to at least two different colors. For example, in the pixel array, multiple light-emitting units in some pixel columns correspond to at least two different colors, and multiple light-emitting units in other pixel columns correspond to only one color. Alternatively, multiple light-emitting units in each pixel column of the pixel array may also correspond to at least two colors.

Moreover, the drive switches 220 of the multiple sub-pixels 200 form a drive array, and multiple drive switches 220 in the same column form a drive column. In the drive array, in drive columns correspondingly connected to pixel columns corresponding to at least two colors, multiple drive switches 220 in at least one column are electrically connected to light-emitting units 210 of the same color.

That is, in an irregular pixel arrangement, the pixel array has pixel columns in which multiple light-emitting units 210 in the column direction do not correspond to the same color, thus a display resolution of the display panel can be effectively improved. As such, drive switches in at least one column of the drive array correspond to the same color, such that drive columns corresponding to the same color can be connected to the peripheral drive circuit by using only one switch element, and only one switch signal line needs to be configured in the peripheral drive circuit for the corresponding drive column, thus the structure of the peripheral drive circuit can be effectively simplified. It should be noted that, the term "column" in the specification does not refer to a column in the sense of predetermined space. For example, it may also be referred to as "row" from a different angle. Similarly, the term "row" in the specification may also be referred to as "column" from a different angle.

Figure 4:
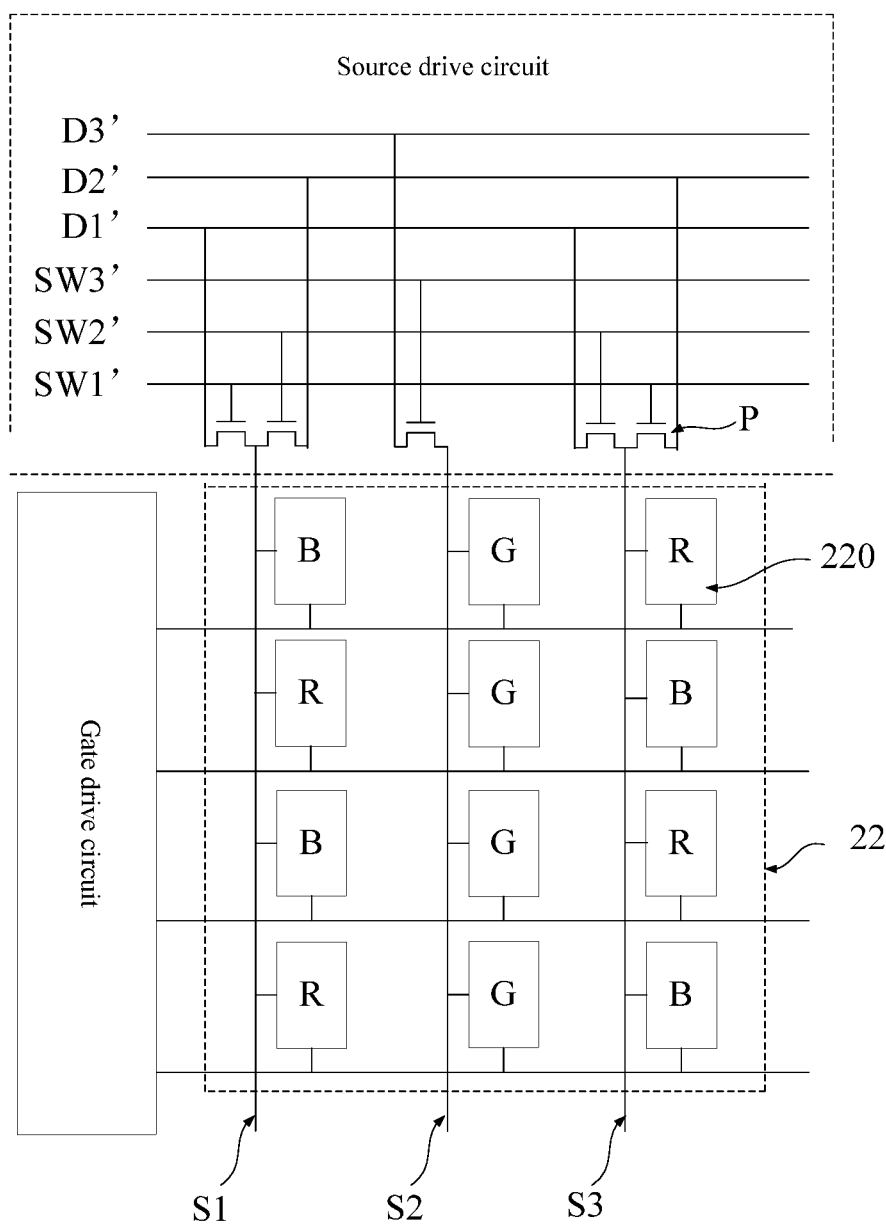
FIG. 4 is a schematic diagram showing a connection between a drive array and a peripheral drive circuit in the display panel according to Embodiment 1 of the present application.
Figure 5:
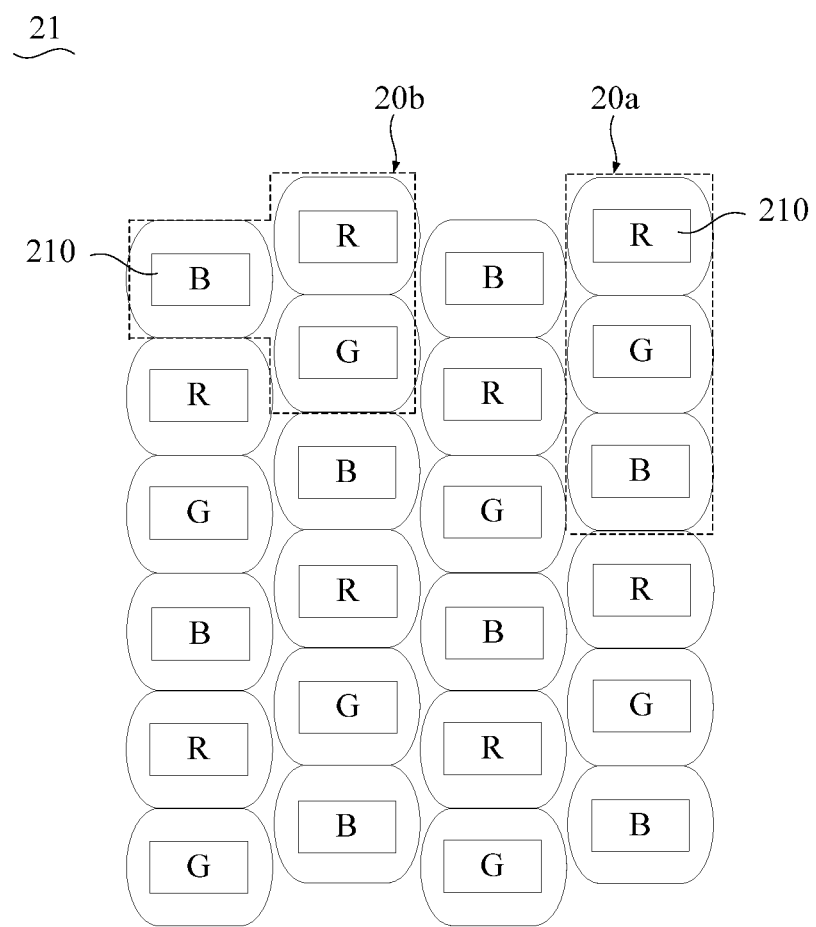
FIG. 5 is a schematic diagram of a pixel array of the display panel according to Embodiment 1 of the present application.

A specific pixel arrangement is explained and described below. FIG. 4 is a schematic diagram showing a connection between a drive array and a peripheral drive circuit in the display panel in Embodiment 1 of the present application. FIG. 5 is a schematic diagram of a pixel array of the display panel in Embodiment 1 of the present application. This embodiment uses only the pixel arrays shown in FIG. 3 and FIG. 5 as examples. However, it should be noted that, provided that multiple light-emitting units in the column direction of a pixel array do not correspond to the same color, an arrangement of a drive array can be adjusted according to the core idea of the present application.

With reference to FIG. 3 and FIG. 5, in the pixel array 21, multiple light-emitting units 210 in at least one pixel column correspond to sub-pixels of at least two different colors, that is, the pixel array 21 has pixel columns in which multiple light-emitting units 210 in the column direction correspond to at least two colors. For example, in this embodiment, the multiple light-emitting units 210 in each pixel column correspond to at least two colors. In the pixel array 21 as shown in FIG. 5, red R, green G, and blue B are respectively comprised in the column direction.

With combined reference to FIG. 3 and FIG. 4, in the drive array 22, multiple drive switches 220 in the same drive column are connected to the same data line, and the data line is connected to the peripheral drive circuit by using a switch element P. Specifically, in a drive column corresponding to the same color, the data line thereof is connected to the peripheral drive circuit by using only one switch element P. In a drive column corresponding to multiple colors, drive switches 220 corresponding to multiple colors are connected to the peripheral drive circuit by respectively using several switch elements P. For example, in FIG. 4, the drive switches 220 in the second column all correspond to green G, and are all connected to data line S2. The data line S2 is connected to the peripheral drive circuit by using only one switch element P. There are drive switches 220 corresponding to red R and blue B in both the first column and the third column. Thus, a data line S1 corresponding to the first column and a data line S3 corresponding to the third column are connected to the peripheral drive circuit by each using two switch elements P.

In this embodiment, an arrangement of the drive array is adjusted based on a pixel arrangement in which each pixel column of the pixel array 21 corresponds to at least two colors, such that at least one drive column in the drive array corresponds to the same color. However, it should be noted that, in other embodiments, when in a pixel array, some pixel columns correspond to at least two colors and other pixel columns correspond to only one color in a pixel array, the arrangement of the drive switches can still be adjusted to enable at least one drive column to correspond to the same color. For example, in other embodiments, there are red light-emitting units and blue light-emitting units in some pixel columns, and there are only green light-emitting units in other pixel columns. In this case, drive switches electrically connected to the green light-emitting units are independently and repeatedly arranged in the column direction, and it is only required to adjust an arrangement of the red drive switches and the blue drive switches. That is, the red drive switches are independently and repeatedly arranged in the column direction, and the blue drive switches are also independently and repeatedly arranged in the column direction.

With continued reference to FIG. 4, the peripheral drive circuit of the display panel is located in the non-display region, and includes a source drive circuit used for providing data signals for the drive switches. In the same drive column, the source drive circuit provides corresponding data signals for the drive switches 220 corresponding to different colors by using different switch elements P. That is, the source drive circuit provides a corresponding data signal for the drive switches corresponding to the same color by using the same switch element P. Therefore, when the drive switches in the same drive column correspond to multiple colors, it is required to provide data signals for the drive switches of corresponding colors by using several switch elements P.

The peripheral drive circuit also includes a gate drive circuit which is connected to a gate line and used for providing a gate drive signal. In the drive array 22, multiple drive switches 220 in the same row are connected to the same gate line. For example, FIG. 4 merely shows drive switches 220 arranged in four rows and three columns, and are accordingly connected to four gate lines. Further, each drive switch 220 also includes a switch transistor, where a source of the switch transistor is connected to the data line, and a gate of the switch transistor is connected to the gate line.

Specifically, the source drive circuit includes several switch signal lines (SW1', SW2', and SW3') and several data signal lines (D1', D2', and D3'). The switch elements P are connected to the switch signal lines and the data signal lines. The switch signal line (SW1'/SW2'/SW3') is used for controlling conduction of the switch element P, such that the data signal line (D1'/D2'/D3') can provide a data signal for drive switches 220 of a corresponding color by using the switch element P. Further, the switch element P is a transistor switch, and a gate of the transistor switch is connected to the switch signal line.

When multiple drive switches 220 in the same column correspond to the same color, a data line of a corresponding drive column is connected to the source drive circuit by using only one switch element P, and only one switch signal line needs to be provided in the peripheral drive circuit. For example, in FIG. 4, the data line S2 in the second drive column is electrically connected to one switch element P, and thus only one switch signal line SW3' needs to be provided to control this switch element P, thus the number of switch signal lines in the peripheral drive circuit are reduced and accordingly the number of the switch elements P are reduced. Preferably, in different drive columns, the switch elements P corresponding to the drive switches 220 of the same color may all be connected to the same switch signal line. For example, in FIG. 4, several switch elements P corresponding to the red R drive switches 220 may all be connected to the same switch signal line SW2'. Several switch elements P corresponding to the blue B drive switches 220 may all be connected to the same switch signal line SW1'.

Focusing on FIG. 4, in all drive columns not corresponding to the same color in the drive array 22, the multiple drive switches 220 in each drive column correspond to sub-pixels of at least two colors. In this embodiment, in all drive columns not corresponding to the same color, the multiple drive switches 220 in each drive column correspond to two colors. The two corresponding colors in different drive columns are identical (that is, the two colors are blue and red or blue and green or red and green in different drive columns), and the drive switches of the two colors may be alternately arranged. Specifically, when the multiple sub-pixels 200 correspond to three colors, drive switches 220 corresponding to one of the colors are independently and repeatedly arranged in the column direction, while drive switches 220 corresponding to the other two colors are alternately arranged in the column direction. For example, the drive switches 220 corresponding to red R are independently and repeatedly arranged in one or more columns in the column direction, while the drive switches 220 corresponding to the other two colors (green G and blue B) are alternately arranged in one or more columns in the column direction.

In this way, in all drive columns corresponding to the same color, the drive switches in each drive column also correspond to the same color, such that the data lines corresponding to the drive columns also correspond to the same color. Thus, the data lines may be connected to the same switch signal line. In multiple drive columns corresponding to the same two colors, each data line is electrically connected to two switch elements P, and switch elements corresponding to drive switches corresponding to one of the two colors may all be connected to the same switch signal line, and switch elements corresponding to drive switches corresponding to the other one of the two colors may all be connected to another switch signal line. It can be seen that, for all drive columns corresponding to the same two colors, only two switch signal lines need to be provided in the peripheral drive circuit, thus the number of the switch signal lines are further reduced and the structure of the peripheral drive circuit is simplified.

In this embodiment, the sub-pixels correspond to three colors, and the green G drive switches 220 are independently and repeatedly arranged in the column direction. That is, the drive switches 220 in the second column in FIG. 4 all correspond to green G, and may all be connected to the same data line S2. The data line S2 is further connected to the switch signal line SW3' and the data signal line D3' by using one switch element P. In addition, the drive switches 220 in both the first column and the third column correspond to the same two colors. In this case, a reverse drive manner may be used to enable the drive switches 220 in the first column and the third column to share two switch signal lines, to optimize the structure of the peripheral drive circuit. Specifically, the drive switches 220 in the first column correspond to red R and blue B, and then, the data line S1 of the first column is connected to two switch elements. One switch element P is connected to the switch signal line SW1' and the data signal line D1'. Thus, the switch signal line SW1' may be used to control conduction of this switch element P, so as to provide a data signal for the blue B drive switches 220. The other switch element P is connected to the switch signal line SW2' and the data signal line D2'. Thus, the switch signal line SW2' may be used to control conduction of this switch element P, so as to provide a data signal for the red R drive switches 220. Similarly, the drive switches 220 in the third column also correspond to red R and blue B. Then, in the two switch elements P connected to the data line S3 of the third column, the first switch element is connected to the switch signal line SW2' and the data signal line D1', and the second switch element is connected to the switch signal line SW1' and the data signal line D2'.

It can be seen that, when multiple sub-pixels correspond to three colors, drive switches corresponding to one of the colors may be arranged in the same column, and drive switches in other two columns correspond to the other two colors. Thus, in the peripheral drive circuit, the structure of the peripheral drive circuit may be further simplified in a reverse drive manner.

With continued reference to FIG. 3, each drive switch 220 is electrically connected to the first electrode 211 via a contact hole 230. Specifically, the first electrode 211 is connected to a drain of the drive switch 220 via the contact hole 230. It can be seen that, an arrangement of the light-emitting units 210 and the drive switches 220 directly affects a layout structure of the first electrodes 211. To be specific, relative positions of the drain of the drive switch 220 and corresponding light-emitting unit 210 partly define the layout structure of the first electrodes 211.

For example, in the layout structure of the first electrodes 111 in FIG. 1, six sub-pixels are schematically shown. In the first sub-pixel 100a, the second sub-pixel 100b, the fourth sub-pixel 100d, and the sixth sub-pixel 100f, each of the contact holes 130 corresponding to the drain of the drive switches 120 is located at one side of the corresponding light-emitting unit 110. In this case, each first electrode 111 extends from the light-emitting unit 110 to the position of the contact hole 130 at one side of the light-emitting unit, so as to achieve an electrical connection between the first electrode 111 and the contact hole 130. However, in the third sub-pixel 100c and the fifth sub-pixel 100e, each drive switch 120 is not located at one side of corresponding light-emitting unit 110, but is arranged at one side of light-emitting unit of another sub-pixel, such that the first electrode 111 needs to be extended along the edge of the light-emitting unit of the another sub-pixel, so as to be connected to the corresponding contact hole. For example, in the third sub-pixel 100c, the first electrode 111 thereof needs to be extended along the edge of the light-emitting unit of the second sub-pixel 100b and the edge of the light-emitting unit of the sixth sub-pixel 100f and bypass the light-emitting unit of the sixth sub-pixel 100f, so as to be connected to its corresponding contact hole 130.

It can be seen that, in the arrangement of the light-emitting units 110 and the drive switches 120 in FIG. 1, during achievement of an electrical connection between the first electrode 111 in the light-emitting unit 110 and the contact hole 130 of the corresponding drive switch 120, the designed layout of the first electrodes 130 is rather complicated, and the area of each first electrode 111 is increased. In this embodiment, without changing the arrangement of the light-emitting units as shown in FIG. 1, positions of the drive switches relative to the light-emitting units can be adjusted, or in other words, a connection between the drain of the drive switch and the first electrode can be adjusted, so as to simplify the layout structure of the first electrodes.

With continued reference to FIG. 3, in this embodiment, a drive column corresponding to the same predetermined color is arranged between two adjacent pixel columns, such that the first electrode 211 corresponding to the same predetermined color only needs to be extended to a region between the two pixel columns, so as to achieve a connection with a contact hole 230 of a drive switch 220 corresponding to the predetermined color. The drive switch 220 includes a drive transistor, and the contact hole 230 is connected to the drain of the drive transistor and the first electrode 230. Therefore, it can be understood that, the position of a square opening as shown in FIG. 3 corresponds to the position of the drain of the drive transistor in the drive switch 220.

Specifically referring to FIG. 3, in the six sub-pixels 200 as shown in FIG. 3, two drive switches 220 corresponding to a predetermined color are disposed in a region between two adjacent pixel columns For example, two drive switches electrically connected to the green G light-emitting units 210 are arranged in the same column and between two adjacent pixel columns, thus effectively utilizing the space between the two adjacent pixel columns. As such, as long as the first electrode 230 corresponding to the green sub-pixel extends to the region between two adjacent pixel columns, the first electrode 230 in the light-emitting unit can be connected to a contact hole 230 of the drive switch corresponding to the predetermined color, without the need to further extend along the edge of another light-emitting unit. Therefore, the area of the first electrode 230 is effectively decreased, and the layout structure of the first electrodes 230 is simplified, such that the connection between the drive switches 220 and the first electrodes 211 is simplified.

Focusing on FIG. 5 below, the pixel array 21 of this embodiment is described in detail. In pixel columns of the pixel array 21, the light-emitting units 210 do not correspond to the same color. In this embodiment, the light-emitting units in the pixel array 21 correspond to three colors in the column direction, namely, blue B, red R and green G The light-emitting units 210 corresponding to the three colors are successively arranged. However, it should be noted that, in other embodiments, the light-emitting units in the pixel array may correspond to only two of the three colors in the column direction. In a row direction of the pixel array 21, the light-emitting units 210 of the same color are staggered, such that the light-emitting units 210 in the row direction also do not correspond to the same color, thus the display uniformity of the display panel is further enhanced.

Further, a pixel unit in a specific display panel may also be defined according to an practical situation. A plurality of sub-pixels forms a plurality of pixel units arranged in an array, and each pixel unit includes at least three sub-pixels corresponding to different colors. In this embodiment, with continued reference to FIG. 5, three sub-pixels corresponding to adjacent three light-emitting units 210 of different colors are defined as one pixel unit. For example, as shown in FIG. 5, three sub-pixels corresponding to adjacent three light-emitting units 210 in the column direction are defined as a pixel unit 20a. Or three sub-pixels corresponding to adjacent three light-emitting units 210 of different colors in two adjacent pixel columns are defined as a pixel unit 20b. That is, the light-emitting units 210 of three sub-pixels in the pixel unit 20b are arranged in two adjacent columns of the pixel array 21. In this case, an arrangement structure obtained by reversing each pixel unit 20b along the row direction by 180 degrees is identical with an arrangement structure of an adjacent pixel unit 20b in the same column. It should be noted that, the pixel unit may be defined according to a specific algorithm of the display panel, which is schematically described but not limited herein.

Embodiment 2

A difference between this embodiment and Embodiment 1 lies in that, a plurality of sub-pixels in this embodiment corresponds to four colors which are, for example, red, green, blue, and white, or red, green, blue, and yellow. A pixel array formed by light-emitting units of the multiple sub-pixels has pixel columns corresponding to two colors in the column direction. For example, in the pixel array, some pixel columns correspond to two (for example, blue and white) of the four colors, and other pixel columns correspond to the other two colors (for example, red and green).

Figure 6:
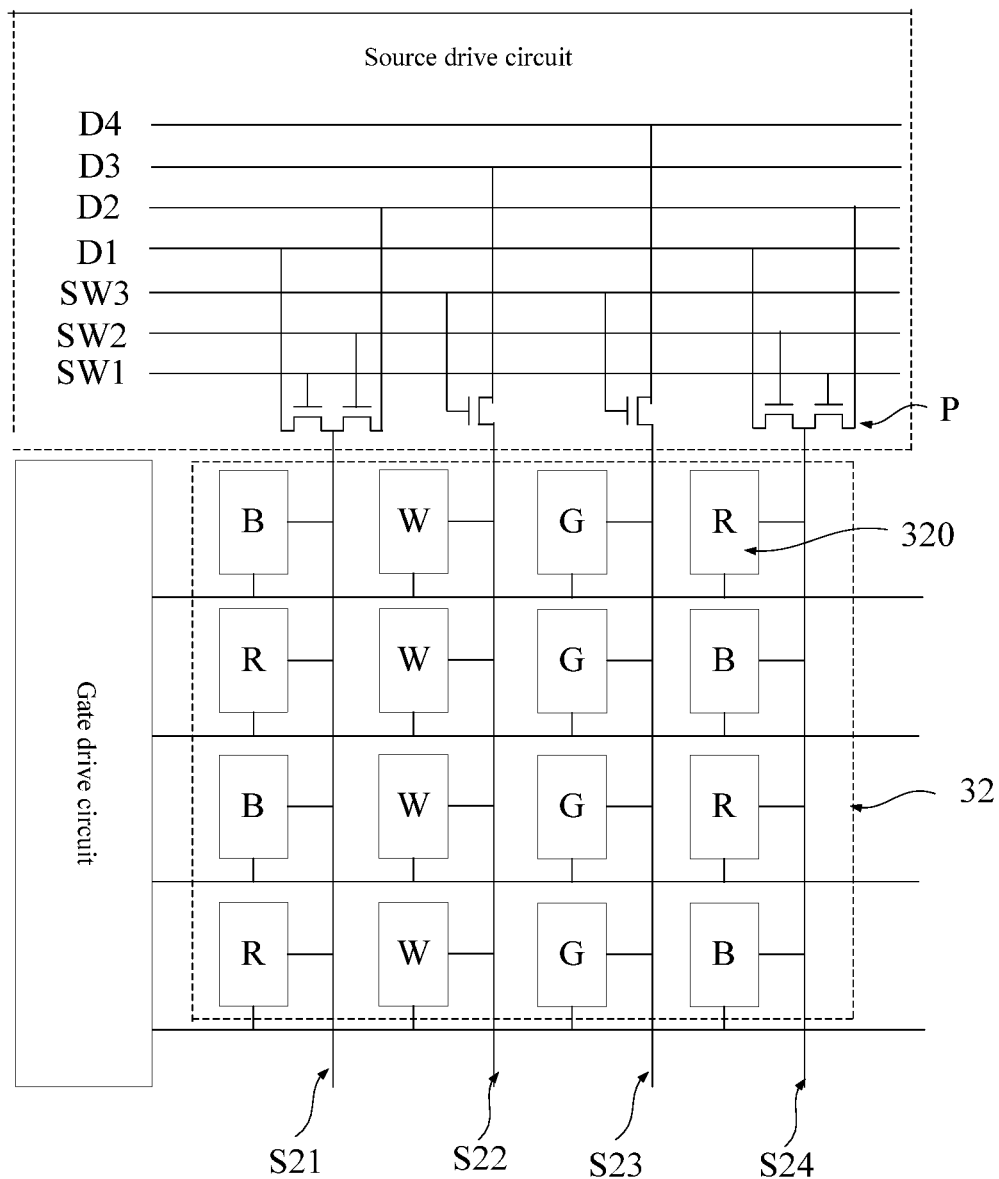
FIG. 6 is a schematic diagram showing a connection between a drive array and a peripheral drive circuit according to a display panel in Embodiment 2 of the present application.
Figure 7:
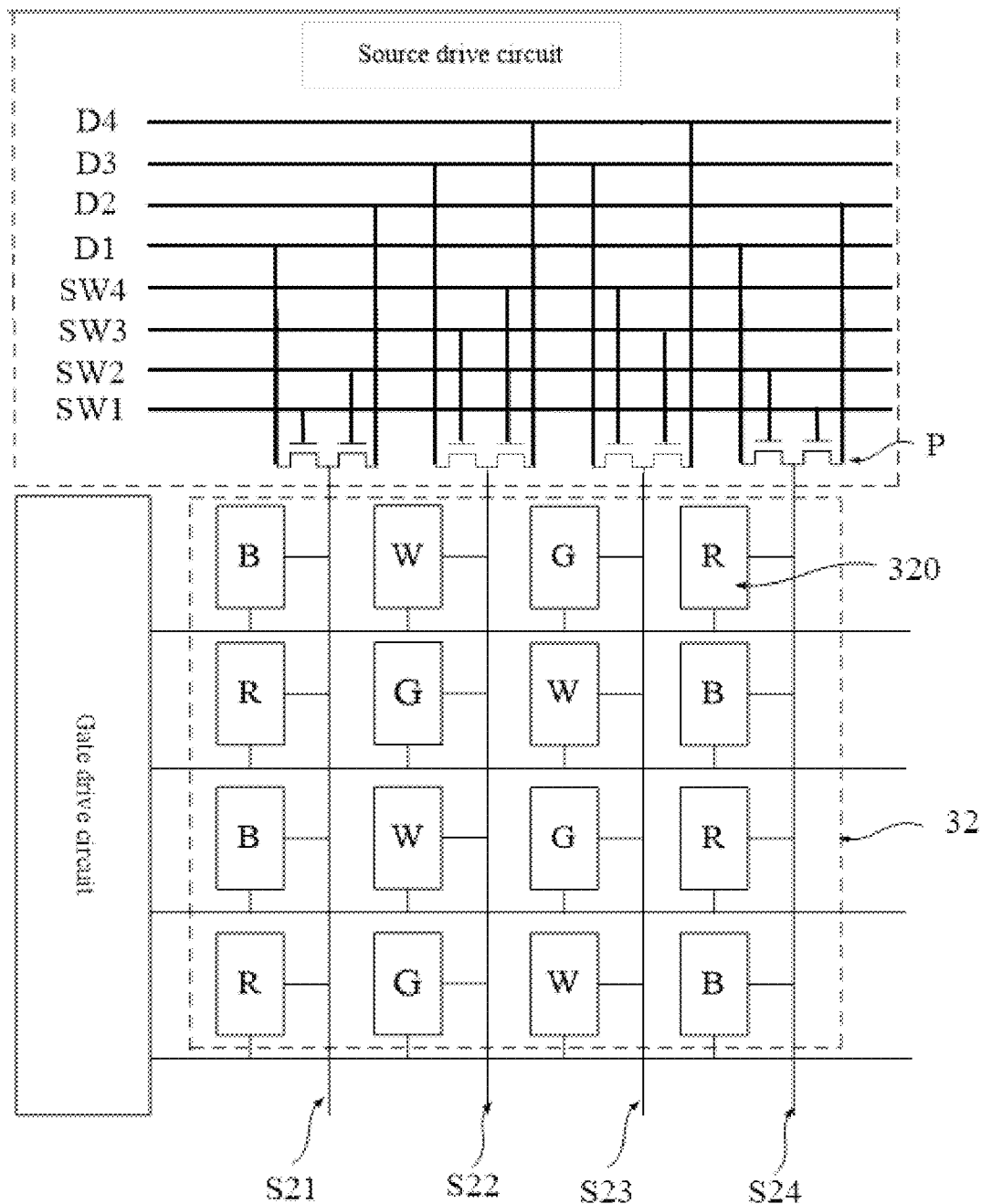
FIG. 7 is a schematic diagram showing an alternative connection between a drive array and a peripheral drive circuit according to a display panel of the present application.

Focusing on FIG. 6, drive switches of the multiple sub-pixels are electrically connected to the light-emitting units of the four colors. In a drive array 32 formed by the drive switches 320, multiple drive switches 320 corresponding to only one of the four colors are independently and repeatedly arranged in the column direction. Alternatively, drive switches 320 corresponding to two of the four colors may also be independently and repeatedly arranged in corresponding columns, and drive switches 320 corresponding to the other two colors are alternately arranged in the column direction. For example, as shown in FIG. 6, a plurality of sub-pixels 200 corresponds to green G, blue B, red R, and white W. Thus, multiple drive switches 320 corresponding to green G are independently and repeatedly arranged in the column direction, and are connected to a data line S23. Multiple drive switches 320 corresponding to white W are independently and repeatedly arranged in the column direction, and are connected to a data line S22. Multiple drive switches 320 corresponding to blue B and red R are alternately arranged in the column direction. The drive switches 320 in a first drive column are connected to a data line S21, and the drive switches 320 in a fourth drive column are connected to a data line S24.

The data line S22 is connected to the drive switches of the same color, and data line S23 is connected to the drive switches of the same color. Therefore, the data lines S22 and S23 can be connected to a switch signal line SW3 separately by using one switch element P, and respectively provide data signals for drive switches 320 of different colors via data signal lines D3/D4. Each of the data lines S21 and S24 is connected to drive switches 320 corresponding to red R and blue B. Therefore, the data lines S21 and S24 can be connected to a switch signal line and a data signal line separately by using two switch elements P. In drive columns corresponding to red R and blue B, switch elements which correspond to different data lines and are used for controlling the same color may be connected to the same switch signal line by using a reverse drive manner. Drive switches corresponding to different colors are controlled by using two different data signal lines for two different colors respectively. As such, the number of the switch signal lines can be effectively reduced, so as to optimize the peripheral drive circuit. For example, for the data line S21 in the first drive column, a drain and a source of one switch element P thereof are connected to the switch signal line SW1 and the data signal line D1 respectively, and a drain and a source of the other switch element P are connected to the switch signal line SW2 and the data signal line D2 respectively. For the data line S24 in the fourth drive column, a drain and a source of one switch element P thereof are connected to the switch signal line SW2 and the data signal line D1 respectively, and a drain and a source of the other switch element P are connected to the switch signal line SW1 and the data signal line D2 respectively.

Moreover, based on the foregoing display panel, the present application also provides a display device having the above-described display panel. The display device has a desired display resolution and a display uniformity accordingly, and the structure of peripheral drive circuit of the display device is simple.

To sum up, different from the conventional pixel arrangement in which the light-emitting units in the column direction correspond to the same color, the display panel provided by the present application applies different colors in the column direction of the pixel array, such that the display panel of the present application has a better display resolution and a display uniformity. As such, drive switches in least one column of the drive array correspond to the same color, such that only one switch signal line needs to be provided in a corresponding column in the peripheral drive circuit, therefore, the structure of the peripheral drive circuit is effectively simplified.

The above merely describes preferred embodiments of the present application, and is not intended to limit the present application. Any replacements and modifications made by persons of ordinary skill in the art according to the disclosed content should all fall within the protection scope of claims of the present application.

What is claimed is:

1. A display panel, comprising:
a plurality of sub-pixels formed in a display region, wherein each of the sub-pixels comprises a light-emitting unit and a drive switch, the light-emitting unit comprises a first electrode, the drive switch is electrically connected to the first electrode, and the light-emitting units in the plurality of sub-pixels form a pixel array comprising a plurality of pixel columns, wherein the light-emitting units in each pixel column of the pixel array correspond to sub-pixels of at least two different colors; the drive switches in the plurality of sub-pixels form a drive array; in the drive array, in drive columns correspondingly connected to the pixel columns comprising sub-pixels of at least two different colors, the drive switches in at least one drive column drive-control the light-emitting units of the same color,
wherein the light-emitting units of the plurality of sub-pixels correspond to three different colors, and the drive switches corresponding to one of the colors are independently and repeatedly arranged in a column direction, while the drive switches corresponding to the other two colors are alternately arranged in the column direction.

2. The display panel of claim 1, wherein the display panel further comprises a peripheral drive circuit located in a non-display region, the peripheral drive circuit comprising a source drive circuit providing data signals to the drive switches.

3. The display panel of claim 2, further comprising a plurality of switch elements, wherein in the same drive column, the source drive circuit provides corresponding data signals for the drive switches corresponding to different colors by the different switch elements.

4. The display panel of claim 3, wherein the source drive circuit comprises a plurality of switch signal lines and a plurality of data signal lines, the switch elements are connected to the switch signal lines and the data signal lines, and the switch signal lines are used for controlling conduction of the switch elements, and the data signal lines provide data signals for the drive switches of a corresponding color by the switch elements.

5. The display panel of claim 4, wherein in each drive column not corresponding to the same color, the plurality of drive switches in the drive column correspond to sub-pixels of at least two colors.

6. The display panel of claim 5, wherein in each drive column not corresponding to the same color, the plurality of drive switches corresponding to the at least two colors are connected to at least two switch elements.

7. The display panel of claim 6, wherein in each drive column not corresponding to the same color, the drive switches corresponding to the same color are connected to the same data signal line through the same switch element.

8. The display panel of claim 4, wherein in different drive columns, each of the switch elements corresponding to the drive switches of the same color is connected to the same switch signal line.

9. The display panel of claim 4, wherein in each drive column corresponding to the same color, the plurality of drive switches in the drive column are connected to the peripheral drive circuit by one switch element.

10. The display panel of claim 4, wherein only one switch signal line is configured in the peripheral drive circuit for the drive columns corresponding to the same color.

11. The display panel of claim 4, wherein only one data signal line is configured in the peripheral drive circuit for the drive columns corresponding to the same color.

12. The display panel of claim 1, wherein a plurality of sub-pixels forms a plurality of pixel units arranged in an array, each pixel unit comprises three sub-pixels corresponding to different colors, and the light-emitting units of the three sub-pixels in each pixel unit are arranged in adjacent two columns of the pixel array.

13. The display panel of claim 12, wherein an arrangement structure obtained by reversing each pixel unit by 180 degrees along a row direction is identical with an arrangement structure of an adjacent pixel unit in a same column.

14. The display panel of claim 1, wherein the light-emitting units of the plurality of sub-pixels correspond to four different colors, and the drive switches corresponding to two of the four different colors are independently and repeatedly arranged in respective columns, while the drive switches corresponding to the other two colors are alternately arranged in a column direction.

15. The display panel of claim 1, wherein each drive switch is electrically connected to the first electrode via a contact hole, a drive column corresponding to a same predetermined color is arranged between adjacent two pixel columns, and the first electrodes corresponding to the same predetermined color extend to a region between the two pixel columns, and are connected to the contact holes of the drive switches corresponding to the same predetermined color.

16. The display panel of claim 1, wherein the plurality of sub-pixels correspond to three different colors, in a column direction of the pixel array, the light-emitting units corresponding to the three different colors are successively arranged, and in a row direction of the pixel array, the light-emitting units corresponding to a same color are staggered along the column direction.

17. The display panel of claim 1, wherein the drive switch includes a drive transistor, and a drain electrode of the drive transistor is electrically connected to the first electrode.

18. A display device, comprising the display panel described in claim claim 1.

19. The display panel of claim 1, wherein the drive switches in each drive column are aligned with each other.

\* \* \* \* \*